US010672606B2

(12) United States Patent
Yoshihara et al.

(10) Patent No.: US 10,672,606 B2
(45) Date of Patent: Jun. 2, 2020

(54) COATING FILM FORMING METHOD, COATING FILM FORMING APPARATUS, AND STORAGE MEDIUM

(71) Applicant: TOKYO ELECTRON LIMITED, Tokyo (JP)

(72) Inventors: Kousuke Yoshihara, Koshi (JP); Takafumi Niwa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/055,975

(22) Filed: Aug. 6, 2018

(65) Prior Publication Data

US 2018/0350594 A1    Dec. 6, 2018

Related U.S. Application Data

(62) Division of application No. 15/350,150, filed on Nov. 14, 2016, now Pat. No. 10,068,763.

(30) Foreign Application Priority Data

Nov. 16, 2015  (JP) ................................ 2015-224193
Dec. 7, 2015   (JP) ................................ 2015-238838

(51) Int. Cl.
*H01L 21/02*    (2006.01)
*H01L 21/67*    (2006.01)
(Continued)

(52) U.S. Cl.
CPC .......... *H01L 21/02282* (2013.01); *B05C 9/12* (2013.01); *B05C 11/08* (2013.01);
(Continued)

(58) Field of Classification Search
None
See application file for complete search history.

(56) References Cited

U.S. PATENT DOCUMENTS 5,695,817 A     12/1997  Tateyama et al.
2003/0203301 A1  10/2003  Soyano et al.
(Continued)

FOREIGN PATENT DOCUMENTS

JP     58-114763 A    7/1983
JP      1207164 A     8/1989
(Continued)

*Primary Examiner* — Bo B Jang
(74) *Attorney, Agent, or Firm* — Nath, Goldberg & Meyer; Jerald L. Meyer

(57) ABSTRACT

A method of forming a coating film includes horizontally supporting a substrate, supplying a coating solution to a central portion of the substrate and spreading the coating solution by a centrifugal force by rotating the substrate at a first rotational speed, decreasing a speed of the substrate from the first rotational speed toward a second rotational speed and rotating the substrate at the second rotational speed to make a surface of a liquid film of the coating solution even, supplying a gas to a surface of the substrate when the substrate is rotated at the second rotational speed to reduce fluidity of the coating solution, and drying the surface of the substrate by rotating the substrate at a third rotational speed faster than the second rotational speed.

13 Claims, 11 Drawing Sheets

(51) Int. Cl.
    *H01L 21/687*     (2006.01)
    *G03F 7/16*     (2006.01)
    *B05C 9/12*     (2006.01)
    *B05C 11/08*     (2006.01)
    *B05C 13/00*     (2006.01)

(52) U.S. Cl.
    CPC .............. *B05C 13/00* (2013.01); *G03F 7/162* (2013.01); *G03F 7/168* (2013.01); *H01L 21/6715* (2013.01); *H01L 21/67028* (2013.01); *H01L 21/67253* (2013.01); *H01L 21/68764* (2013.01); *H01L 21/67109* (2013.01)

(56) References Cited

U.S. PATENT DOCUMENTS

| | | |
|---|---|---|
| 2008/0057194 A1 | 3/2008 | Tanaka |
| 2015/0004311 A1 | 1/2015 | Ichino et al. |
| 2015/0093883 A1* | 4/2015 | Moriyama ........ H01L 21/67109 |
| | | 438/478 |
| 2016/0129589 A1 | 5/2016 | Liang et al. |

FOREIGN PATENT DOCUMENTS

| | | |
|---|---|---|
| JP | 2001291660 A | 10/2001 |
| JP | 2002299204 A | 10/2002 |
| JP | 2003-037053 A | 2/2003 |
| JP | 200860462 A | 3/2008 |
| JP | 4805758 B2 | 8/2011 |
| JP | 2015-009180 A | 1/2015 |
| JP | 201526792 A | 2/2015 |

* cited by examiner

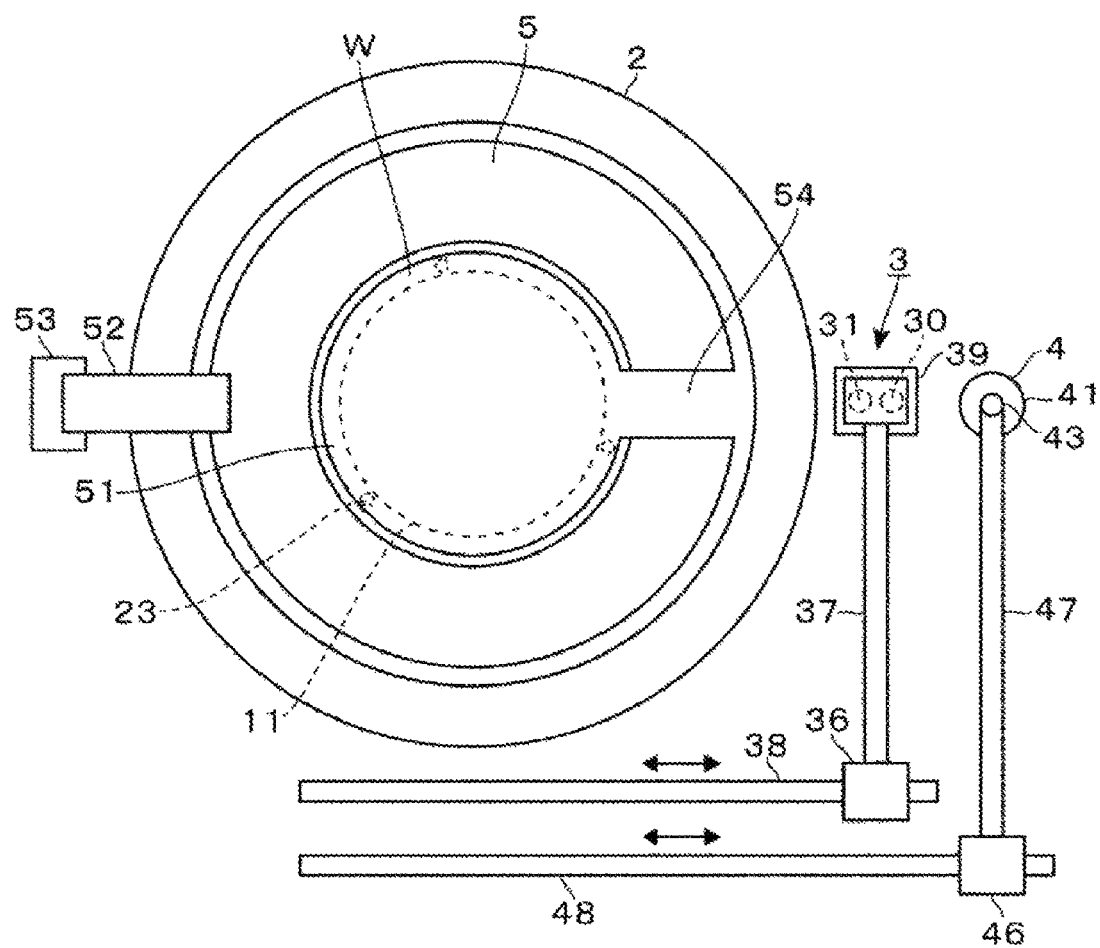

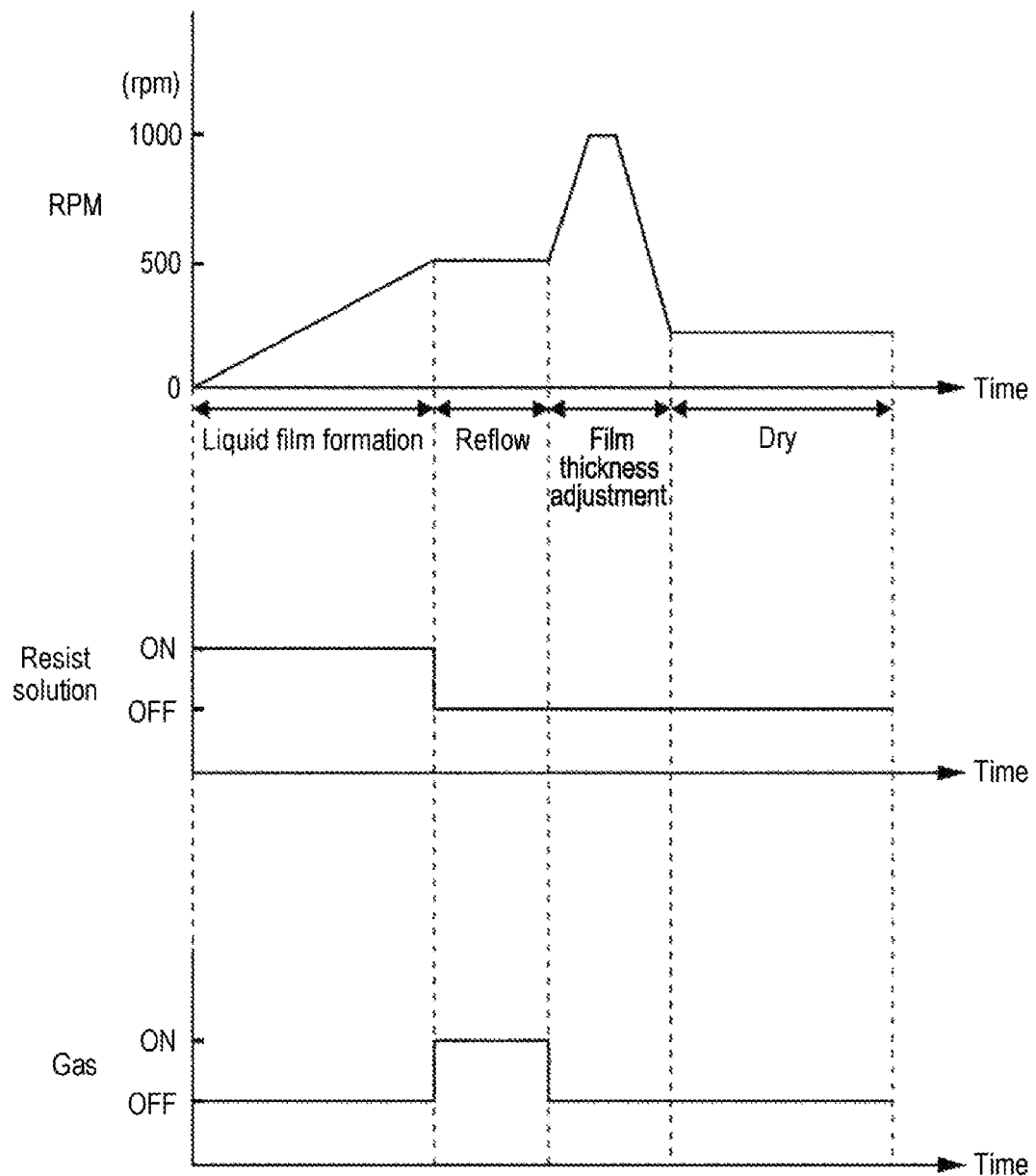

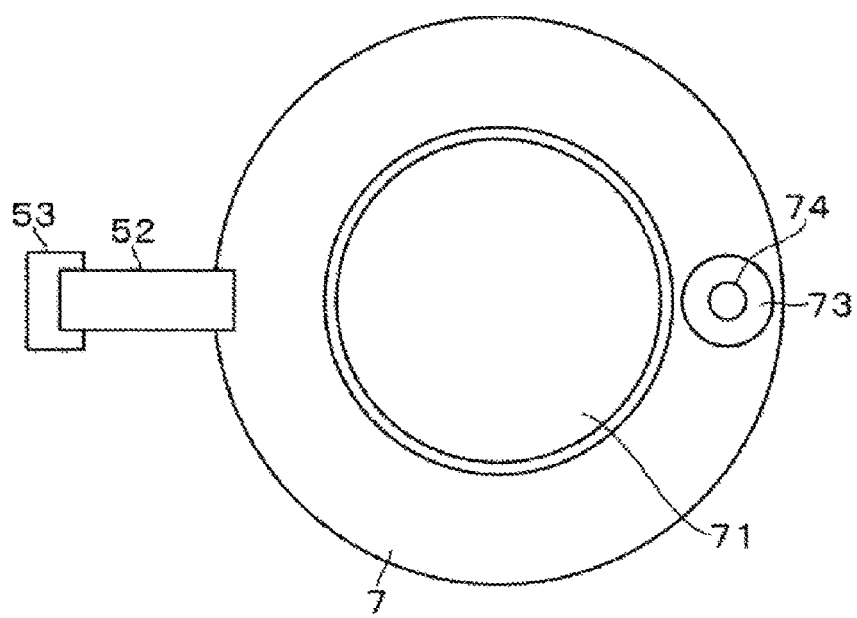
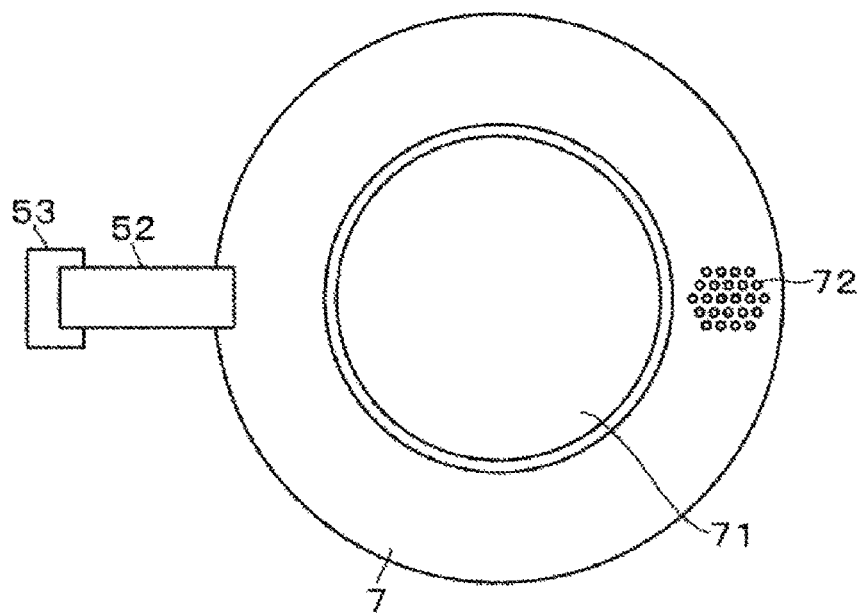

COATING FILM FORMING METHOD, COATING FILM FORMING APPARATUS, AND STORAGE MEDIUM

CROSS-REFERENCE TO RELATED APPLICATION(S)

This is a Divisional Application of U.S. patent application Ser. No. 15/350,150, filed Nov. 14, 2016, claiming the benefit of Japanese Patent Application Nos. 2015-224193 and 2015-238838, filed on Nov. 16, 2015 and Dec. 7, 2015, respectively, in the Japan Patent Office, the disclosures of which are incorporated herein in their (its) entirety by reference.

TECHNICAL FIELD

The present disclosure relates to a technique of forming a coating film by spreading a coating solution supplied to a substrate by rotating the substrate.

BACKGROUND

A spin coating method is commonly used in forming a coating film, for example, a resist film, on a substrate. In this method, a resist solution as a coating solution is supplied to a central portion of a surface of the substrate supported in a spin chuck and rotated, and the resist solution is spread to a peripheral portion of the substrate by a centrifugal force, and thereafter, the substrate is continuously rotated to dry a liquid film of the surface of the substrate to form the resist film. A completed film thickness (target film thickness) of the resist film is adjusted by a revolution per minute (RPM) of the substrate or viscosity of the resist solution.

In a factory, there is a request for forming resist films having various film thicknesses in each process using the same resist solution, namely, the same type of resist solution and solvent having the same viscosity. However, when a film is formed on a surface of a substrate through spin coating, if an RPM of the substrate is too high, there is a possibility that a surface of the film is damaged by an air current formed on the substrate. On the other hand, if the RPM is too low, the time required for drying is lengthened.

For this reason, the usable range of the RPM of the substrate is limited, and thus, an adjustment range of a film thickness of the resist film formed using the same resist solution is limited. Therefore, in order to form a resist film having a film thickness exceeding the adjustment range, it is required to prepare resist solutions having different viscosities. In this case, a coating solution line may be prepared for each viscosity of resist solution, or in case of using a common coating solution line, a tank of resist solution is required to be exchanged, causing a device to be increased in size or complexity of an operation.

One of the related arts discloses a technique of supplying a solvent gas to a region of a substrate in which a thick film is formed and supplying a dry gas to a region of the substrate in which a thin film is formed to make a film thicknesses uniform. However, the related art does not disclose a technique of adjusting an average film thickness of a formed coating film.

SUMMARY

Some embodiments of the present disclosure provide a technique capable of adjusting a film thickness of a coating film in forming the coating film on a substrate through a spin coating method.

According to one embodiment of the present disclosure, a method of forming a coating film, including horizontally supporting a substrate in a rotatable substrate support part around a vertical axis; supplying a coating solution to a central portion of the substrate and spreading the coating solution by a centrifugal force by rotating the substrate at a first rotational speed; decreasing a speed of the substrate from the first rotational speed toward a second rotational speed and rotating the substrate at the second rotational speed to make a surface of a liquid film of the coating solution even; supplying a gas to a surface of the substrate when the substrate is rotated at the second rotational speed to reduce fluidity of the coating solution; and drying the surface of the substrate by rotating the substrate at a third rotational speed faster than the second rotational speed.

According to one embodiment of the present disclosure, a coating film forming apparatus, including a substrate support part configured to horizontally support a substrate; a rotation mechanism configured to rotate the substrate support part around a vertical axis; a coating solution nozzle configured to supply a coating solution for forming a coating film to the substrate; a gas supply part configured to supply a gas for reducing fluidity of the coating solution to a surface of the substrate; and a control part configured to execute a process of supplying the coating solution to a central portion of the substrate and spreading the coating solution by a centrifugal force by rotating the substrate at a first rotational speed; a process of decreasing a speed of the substrate from the first rotational speed toward a second rotational speed and rotating the substrate at the second rotational speed to make the surface of the substrate even; a process of supplying the gas to the substrate to reduce fluidity of the coating solution; and a process of drying the substrate by rotating the substrate at a third rotational speed faster than the second rotational speed.

According to one embodiment of the present disclosure, a non-transitory computer-readable storage medium storing a computer program for use in a coating film forming apparatus for forming a coating film on a substrate, wherein the program is organized to execute the method of forming a coating film described above.

According to a second embodiment of the present disclosure, a method of forming a coating film, including horizontally supporting a substrate in a rotatable substrate support part around a vertical axis; supplying a coating solution to a central portion of the substrate while rotating the substrate; making a liquid film of the coating solution even by rotating the substrate at an RPM within a range of ±50 rpm with respect to an RPM of the substrate when the supply of the coating solution is completed; supplying a gas to a surface of the substrate while the making a liquid film of the coating solution even is performed, to reduce fluidity of the coating solution; maintaining an RPM of the substrate at an RPM higher than both of an RPM when the supply of the coating solution is completed and an RPM when the making a liquid film of the coating solution even is performed, in order for a film thickness of the coating film to reach a target film thickness; and drying the coating film by decreasing the RPM of the substrate.

According to the second embodiment of the present disclosure, a coating film forming apparatus, including a substrate support part configured to horizontally support a substrate; a rotation mechanism configured to rotate the substrate support part around a vertical axis; a coating solution nozzle configured to supply a coating solution for forming a coating film to the substrate; a gas supply part configured to supply a gas for reducing fluidity of the coating solution to the surface of the substrate; and a control part configured to execute a process of supplying the coating solution to a central portion of the substrate while rotating the substrate; a process of making a liquid film of the coating solution even by rotating the substrate at an RPM within a range of ±50 rpm with respect to an RPM of the substrate when the supply of the coating solution is completed; a process of supplying the gas to the surface of the substrate while the process of making the liquid film of the coating solution even is performed, to reduce fluidity of the coating solution; a process of maintaining an RPM of the substrate at an RPM higher than both of an RPM when the supply of the coating solution is completed and an RPM when the process of making the liquid film of the coating solution even is performed, in order for a film thickness of the coating film to reach a target film thickness; and a process of drying the coating film by decreasing the RPM of the substrate.

According to the second embodiment of the present disclosure, a non-transitory computer-readable storage medium storing a computer program for use in a coating film forming apparatus for forming a coating film by supplying a coating solution to a surface of a substrate horizontally supported in a rotational substrate support part around a vertical axis, wherein the program is organized to execute the method of forming a coating film according to the second embodiment.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a plane view of the coating film forming apparatus.

FIG. 7 is an explanatory view illustrating a time chart of an RPM of a wafer, and ON/OFF of supply of a resist solution and a gas.

FIGS. 10A and 10B are plane views illustrating another example of a ring plate.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
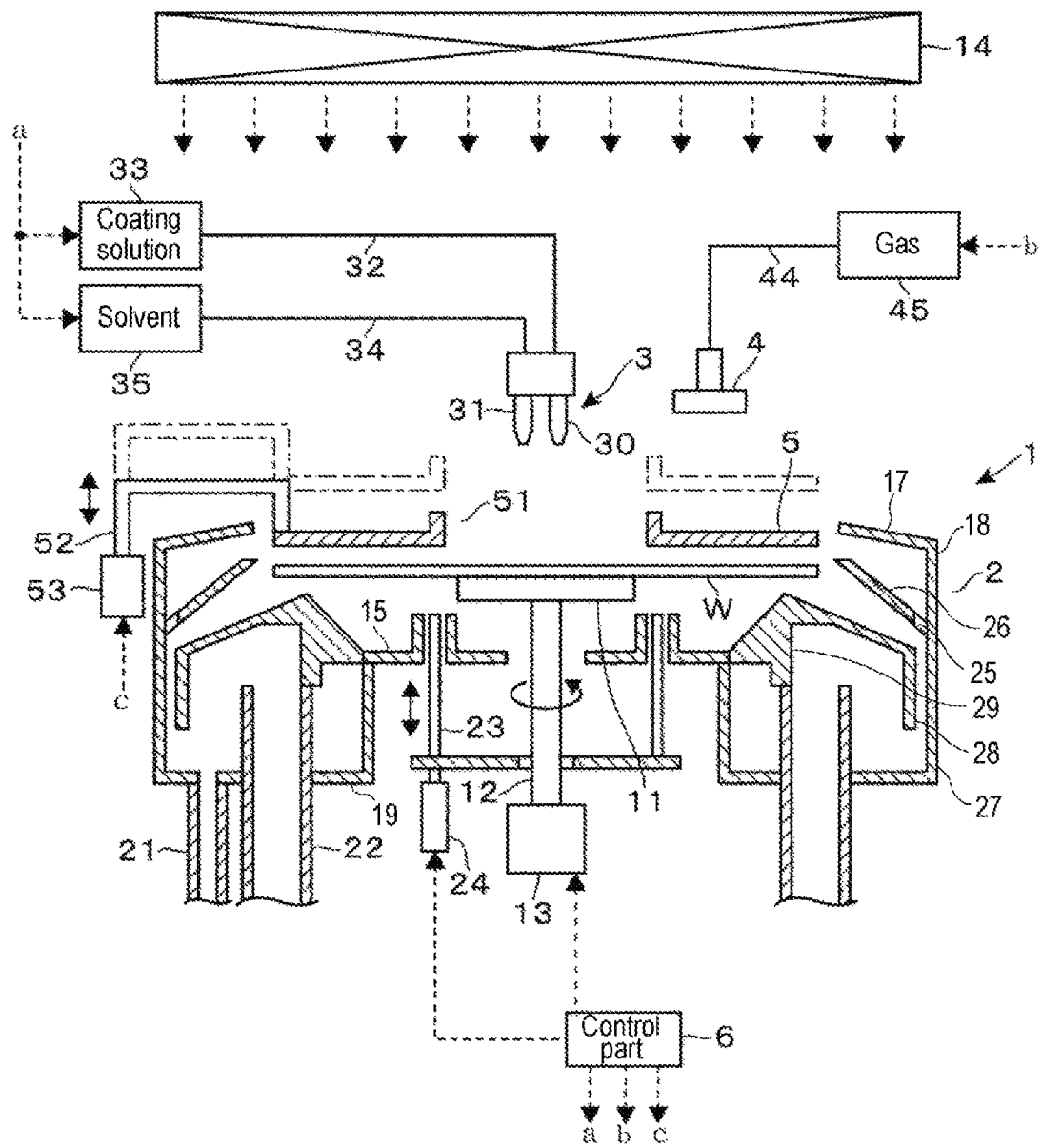
FIG. 1 is a longitudinal cross-sectional side view illustrating an embodiment of a coating film forming apparatus of the present disclosure.

An embodiment of a coating film forming apparatus of the present disclosure will be described using an example of forming a resist film as a coating film on a semiconductor wafer (hereinafter, referred to as a "wafer") W as a substrate. As illustrated in FIGS. 1 and 2, a coating film forming apparatus 1 includes a spin chuck 11 forming a substrate support part for supporting and rotating a wafer W having a diameter of, for example, 300 mm. The spin chuck 11 is configured to attract a central portion of a rear surface of the wafer W to horizontally support the wafer W and rotate in a clockwise direction, when viewed from the plane, about a vertical axis by a rotation mechanism 13 connected by a shaft 12.

A cup 2 is installed around the wafer W supported on the spin chuck 11. The cup 2 is configured to allow a liquid to be exhausted through an exhaust pipe 21 and allow a liquid dropped from the wafer W into the cup 2 to be removed by a liquid discharge pipe 22. In the drawing, reference numeral 23 denotes an elevation pin, and is configured to be moved up and down by an elevation mechanism 24 so as to exchange the wafer W (not shown) between a transfer mechanism of the wafer W and the spin chuck 11.

The cup 2 includes a mountain-shaped guide part 29 installed around a circular plate 15 and having a ring shape whose cross-section has a mountain shape, and an annular vertical wall 28 is installed to extend downwardly from an outer peripheral end of the mountain-shaped guide part 29. The mountain-shaped guide part 29 guides a liquid dropped from the wafer W to an outer side of the wafer W downwardly.

Further, a vertical cylindrical portion 27 configured to surround an outer side of the mountain-shaped guide part 29 and an upper guide part 26 extending slantingly toward an inner upper side from an upper edge of the cylindrical portion 27 are installed. A plurality of openings 25 are formed in a circumferential direction in the upper guide part 26. Further, on a lower side of the cylindrical portion 27, a ring-shaped liquid receiving part 19 whose cross-section has a concave shape is formed on a lower side of the mountain-shaped guide part 29 and the vertical wall 28. In the liquid receiving part 19, the exhaust pipe 21 is connected to an outer peripheral side, and the liquid discharge pipe 22 is installed to extend into an inner peripheral side than the exhaust pipe 21 from a lower side.

In addition, a cylindrical portion 18 is installed to extend upwardly from a periphery of a base end side of the upper guide part 26, and a sloped wall 17 is installed to extend from an upper edge of the cylindrical portion 18 to an inner upper side. A liquid scattered by rotation of the wafer W is received by the sloped wall 17, the upper guide part 26, and the vertical walls 28 and introduced to the exhaust pipe 21.

The coating film forming apparatus 1 includes a nozzle unit 3 for supplying a coating solution and a solvent. A coating solution nozzle 30 for discharging a coating solution and a solvent nozzle 31 for discharging a solvent are installed in a front end portion of the nozzle unit 3. As the coating solution, for example, a resist solution having a viscosity of 1 kg/m·s (1000 cp) or higher is used, and as the solvent, a pre-wetting solvent, for example, a solvent for a resist solution is used. The coating solution nozzle 30 and the solvent nozzle 31 are connected to a coating solution supply mechanism 33 and a solvent supply mechanism 35 through supply paths 32 and 34, respectively. The coating solution supply mechanism 33 and the solvent supply mechanism 35 have a device such as, for example, a pump, a valve, or a filter, and are configured to discharge a predetermined amount of a resist solution and a solvent from a front end of the coating solution nozzle 30 and the solvent nozzle 31, respectively.

As illustrated in FIG. 2, the coating solution nozzle 30 and the solvent nozzle 31 are supported by a common arm 37 configured to be moved up and down or moved in a horizontal direction by a moving mechanism 36, and are configured to be moved between a central portion of the wafer W and an external retraction position of the cup 2. In the drawing, reference numeral 38 denotes a guide for allowing the moving mechanism 36 to be moved in a horizontal direction as mentioned above. In the retraction position, for example, a standby bus 39 is installed.

Figure 3A:
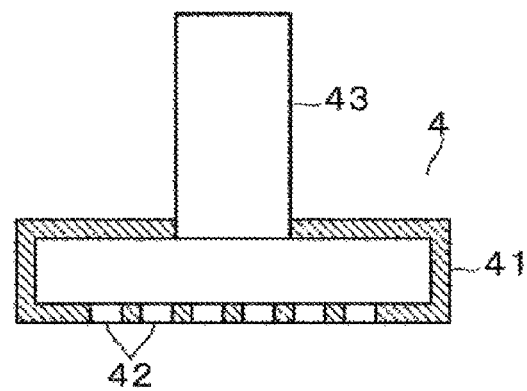
FIGS. 3A and 3B are a side view and a bottom view illustrating a gas nozzle used in the coating film forming apparatus, respectively.
Figure 3B:
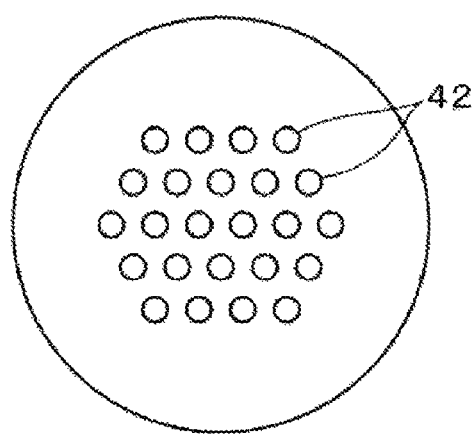

In addition, the coating film forming apparatus 1 includes a gas nozzle 4 for supplying a gas. The gas serves to reduce fluidity of the resist solution, and an inert gas such as, for example, a nitrogen ($N_2$) gas is used. FIG. 3A is a side view of the gas nozzle 4, and FIG. 3B is a bottom view of the gas nozzle 4. As illustrated in this drawing, the gas nozzle 4 includes, for example, a flat cylindrical buffer chamber 41, and a plurality of gas discharge holes 42 are distributed on a lower surface of the buffer chamber 41. For example, a cylindrical gas introduction part 43 is installed in a central portion of an upper surface of the buffer chamber 41, and the gas introduction part 43 is connected to a gas supply mechanism 45 through a supply path 44.

The gas supply mechanism 45 includes, for example, a valve or a device such as a gas heating mechanism, and is configured to discharge a gas heated to have a temperature of, for example, 60 degrees C. in a shower form, from the gas nozzle 4. The heating mechanism is configured by installing a heating part formed as, for example, a heater, for example, around a flow passage of a gas, and allowing the gas to pass through the flow passage so as to be heated. In this example, since the gas nozzle 4 discharges a gas through the plurality of gas discharge holes 42 of the buffer chamber 41 in a shower form, a low flow rate of gas is supplied at a high flow velocity in a wide range. The gas nozzle 4, the supply path 44, and the gas supply mechanism 45 constitute a gas supply part. As illustrated in FIG. 2, the gas nozzle 4 is supported by an arm 47 configured to be moved up and down or moved in a horizontal direction by a moving mechanism 46 and is configured to be moved between a position on the wafer W and an external retraction position of the cup 2. In the drawing, reference numeral 48 denotes a guide for allowing the moving mechanism 46 to be moved in a horizontal direction as mentioned above.

As illustrated in FIGS. 1 and 2, the coating film forming apparatus 1 includes a ring plate 5 as an annular member. The ring plate 5 is formed to have an annular shape in which a circular opening 51 having a diameter of, for example, 100 mm to 200 mm is formed in a central portion of a circular plate. The ring plate 5 is formed along a peripheral portion of the wafer W supported on the spin chuck 11 to cover an upper side of the peripheral portion, and is installed such that the center of the ring plate 5, i.e., the center of the opening 51, is positioned on a rotary shaft of the spin chuck 11.

The ring plate 5 is supported by a support member 52 in a horizontal posture, and configured to be moved up and down by a moving mechanism 53 for moving up and down the support member 52 between an ascending position indicated by the chain line in FIG. 1 and a descending position indicated by the solid line. In this example, the descending position corresponds to a position where the ring plate 5 covers an upper side of the peripheral portion of the wafer W, and the ascending position corresponds to a standby position. A distance between a lower surface of the ring plate 5 and a surface of the wafer W in the descending position is set to fall within a range of, for example, 0.5 mm to 50 mm. Further, in the ring plate 5, a cutout portion 54 is formed to extend from an inner periphery to an outer periphery in a portion of a circumferential direction thereof in order to form a movement region where the gas nozzle 4 moves in a horizontal direction along a radial direction of the wafer W.

The movement regions of the cup 2, the nozzle unit 3, and the gas nozzle 4 described above are formed within a housing (not shown) and a fan filter unit (FFU) 14 as illustrated in FIG. 1 is installed in a ceiling portion of the housing. The FFU 14 is configured to supply a clean gas as a down flow toward the cup 2.

Further, the coating film forming apparatus 1 includes a control part 6. The control part 6 is configured as, for example, a computer, and has a program storage part (not shown). The program storage part stores a program having a command (step group) organized to perform a forming process of a coating film to be described later. The program also includes a recipe describing the procedure, and an operation of each part of the coating film forming apparatus 1 is controlled by outputting a control signal to each part from the control part 6 by the program. Specifically, each of the operations such as a change of an RPM of the wafer W by the rotation mechanism 13, a movement of the nozzle unit 3 and the gas nozzle 4, a supply or a cutoff of a coating solution (resist solution) and a solvent from the coating solution supply mechanism 33 and the solvent supply mechanism 35 to the coating solution nozzle 30 and the solvent nozzle 31, a supply or a cutoff of a gas from the gas supply mechanism 45 to the gas nozzle 4, and elevation of the ring plate 5 is controlled. The program is stored in the program storage part in a state where it is received in a storage medium such as, for example, a hard disk, a compact disk, a magneto optic disk, or a memory card.

<Coating Film Forming Method>

First Embodiment

Figure 4:
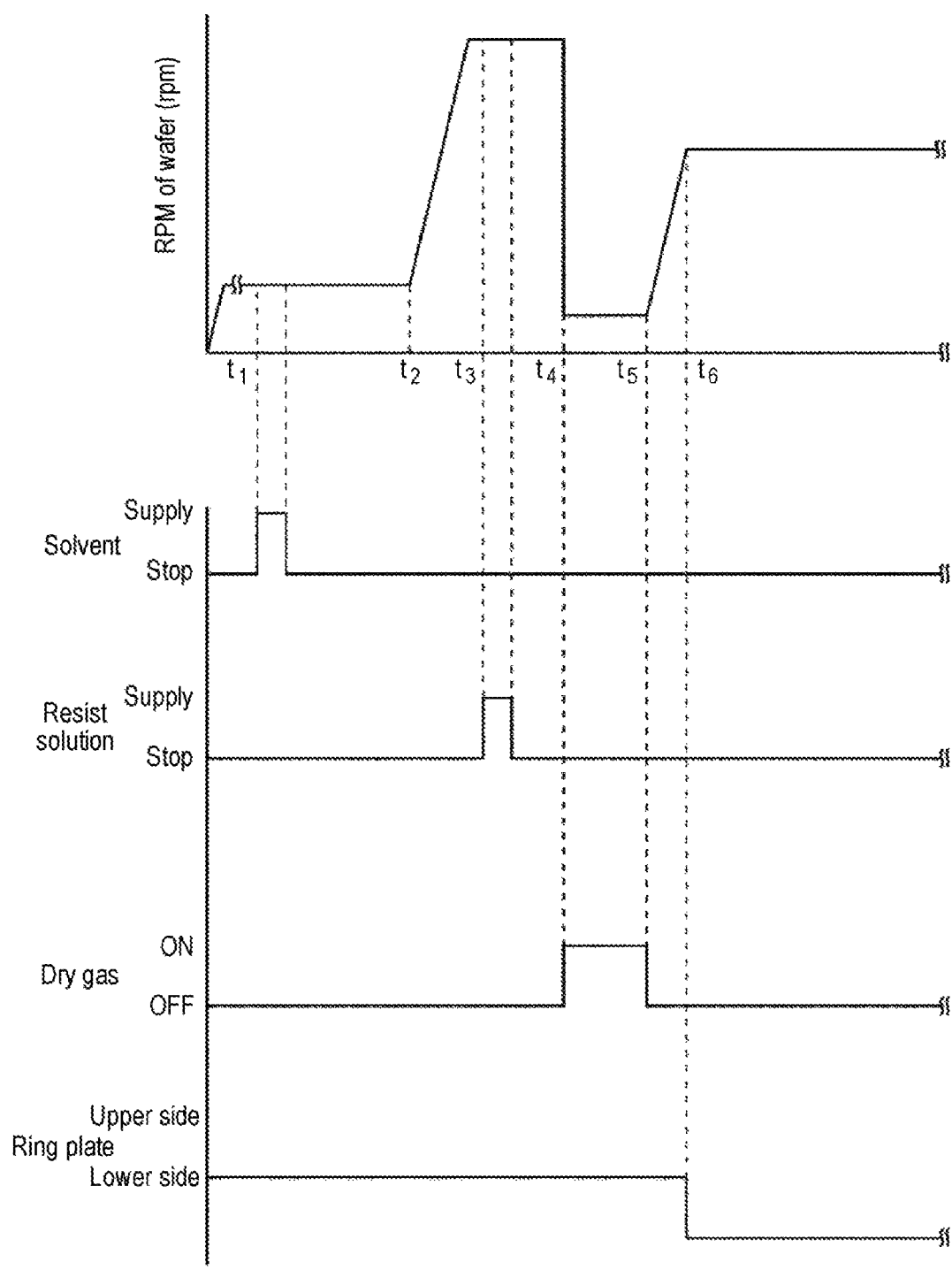
FIG. 4 is an explanatory view illustrating a time chart of an RPM of a wafer, a supply and a stop of a solvent and a resist solution, ON/OFF of supply of a dry gas, and a height position of a ring plate.

Next, an operation of a resist coating apparatus will be described. The uppermost portion of FIG. 4 illustrates a profile regarding a lapse time of a rotational speed of the wafer W. A value of the vertical axis of the graph represents a rotational speed (RPM) (revolution/min.) of the wafer W, and in this graph, a speed pattern is visually illustrated to facilitate understanding of the present disclosure, which does not faithfully reflect a pattern of a rotational speed of an actual device. Further, the graphs starting from the second stage are a time chart representing a supply and a stop of a solvent, a time chart representing a supply and a stop of a resist solution, a time chart representing a supply and a stop of a dry gas, and a time chart representing a position of the ring plate 5.

First, in a state where the ring plate 5 is positioned in the ascending position, a wafer W having a diameter of, for example, 300 mm is loaded to the resist coating apparatus by a transfer mechanism (not shown) installed outside the resist coating apparatus. Further, at this time, as mentioned above, a down flow is formed toward the cup 2 by the FFU 14 as mentioned above.

Thereafter, the wafer W is mounted on the spin chuck 11 through a cooperative operation of the external transfer mechanism and the elevation pin 23. A series of operations including this operation are executed by the program in the control part 6.

When the wafer W is mounted on the spin chuck 11, the nozzle unit 3 is subsequently moved and the solvent nozzle 31 is positioned above a central portion of the wafer W. Thereafter, as illustrated in FIG. 4, a solvent is supplied to the central portion of the wafer W from the solvent nozzle 31 at time t1, while rotating the wafer W at a rotational speed of, for example, 1000 rpm. The supplied solvent is rapidly spread from the center of the wafer W toward a peripheral portion thereof by a centrifugal force by rotation of the wafer W, wetting the entire surface of the wafer W.

Figure 8A:
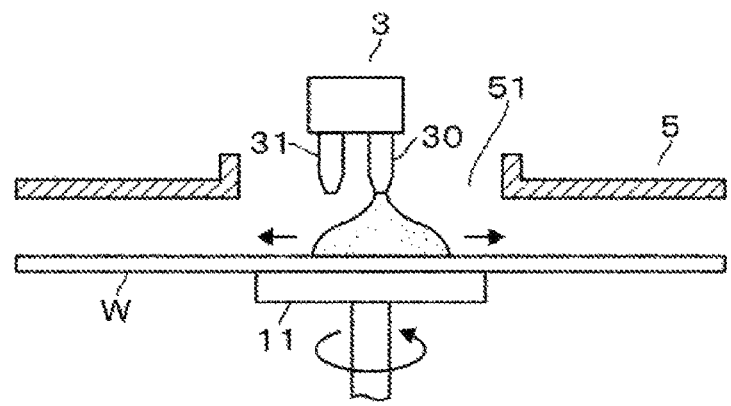
FIGS. 8A to 8C are explanatory views illustrating a process of forming a resist film.

Subsequently, at time t2, the wafer W is accelerated to a speed of, for example, 3000 rpm. Further, the coating solution nozzle 30 is positioned above the central portion of the wafer W, and when the rotational speed reaches 3000 rpm, at time t3, the resist solution is supplied from the coating solution nozzle 30 toward the central portion of the wafer W as illustrated in FIG. 8A. Thus, the resist solution discharged to the central portion of the wafer W is spread from the central portion toward the peripheral portion along the surface of the wafer W by the centrifugal force.

Figure 8B:
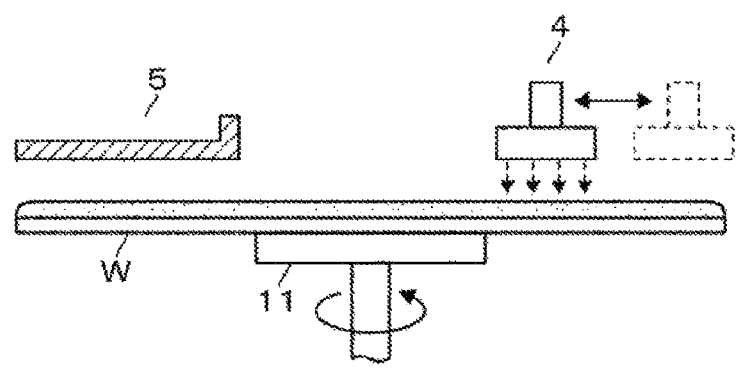

At time t4 immediately thereafter, the rotational speed of the wafer W starts to be rapidly decelerated to, for example, 500 rpm. Further, the gas nozzle 4 is moved to supply a gas to a position, for example, 50 mm spaced apart from the center of the wafer. After the time t4 at which the rotational speed of the wafer W reaches 500 rpm, a reflow process of maintaining the rotational speed of the wafer W at 500 rpm, for example, for 7 seconds, is performed. The reflow process is a process of rotating the wafer W at a low speed to make a liquid surface of the coating solution even. Further, in parallel with the reflow process starting from the time t4, as illustrated in FIG. 8B, a dry gas is supplied for, for example, 7 seconds, while repeatedly reciprocating the gas nozzle 4 between a position of 50 mm from the center of the wafer W to a position of the periphery of the wafer W (150 mm from the center of the wafer W). At this time, as the dry gas is spread, the solvent included in the film of the resist solution spread to the surface of the wafer W is volatilized to increase viscosity and thus reduce fluidity.

Figure 8C:
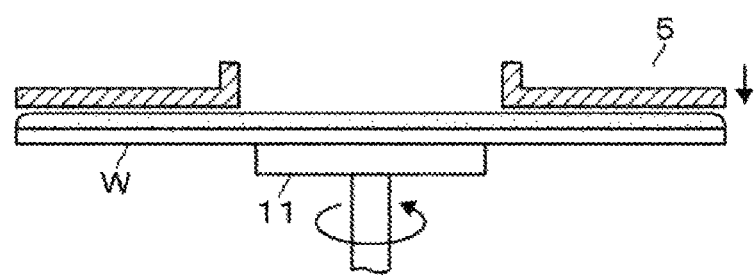

Thereafter, at time t5, the rotational speed of the wafer W is increased to a third rotational speed, e.g., 1800 rpm. And then, at time t6 at which the rotational speed of the wafer W reaches 1800 rpm, the ring plate 5 is moved down to a descending position and maintained for, for example, 10 seconds, as illustrated in FIG. 8C. At this time, since the wafer W is rotated at a high speed, the ambience of the wafer W is under a negative pressure atmosphere. Accordingly, a gas forming a down flow which forms a clean atmosphere and which is supplied from the FFU 14 is supplied to the central portion of the surface of the wafer W through the opening 51 of the ring plate 5, forming an air current flowing toward the peripheral portion of the wafer W. The air current flowing to the peripheral portion of the wafer W is introduced to the cup 2 and exhausted through the liquid discharge pipe 22. Due to the air current, the film of the resist solution on the surface of the wafer W is further dried to form the resist film.

As the rotational speed of the wafer W is increased, the air current on the wafer W is easy to be a turbulent flow, but since a height of a flow path of the air current from the central portion of the wafer W toward the peripheral portion thereof is limited by a lower surface of the ring plate 5, it is difficult for the air current to be a turbulent flow. Thus, distortion of the film due to a turbulent flow is suppressed on the surface of the film of the resist solution, obtaining desired film thickness uniformity.

Further, by increasing the rotational speed of the wafer W to, for example, 1800 rpm, the resist solution is further spread on the surface of the wafer W, but fluidity is reduced due to the sprayed dry gas. Therefore, it is difficult for the resist film to be thinned when the resist solution is intended to be spread through high speed rotation of the wafer W. Thus, a resist film obtained by completing a series of steps has a large film thickness, compared with a resist film obtained without supplying a dry gas.

According to the aforementioned embodiment, in the spin coating method, after the resist solution is spread on the wafer W through high speed rotation, the wafer W is rotated at a low speed to make the surface of the wafer even, during which a dry gas is supplied to the surface of the wafer W to reduce the fluidity of the resist solution, and thereafter, the rotational speed of the wafer W is increased to dry the resist film. By reducing the fluidity of the resist solution by supplying a dry gas to the surface of the wafer W, it is possible to increase a film thickness of the resist film, compared with a case where the dry gas is not supplied. Thus, since the film thickness can be adjusted by supplying the dry gas to the surface of the wafer W, in addition to the adjustment of the film thickness by adjusting the RPM of the wafer W, it is possible to form a film having a film thickness in a broader range with one type of resist solution.

Further, by covering an upper side of the peripheral portion of the wafer W by the ring plate 5 when the coating process is performed on the wafer W, an air current above the peripheral portion is flow-rectified, and when the RPM of the wafer W is increased, formation of a turbulent flow above the peripheral portion of the wafer W is suppressed. However, when the RPM of the wafer W is increased, the resist film is reduced in thickness. Thus, during the process of making the surface of the wafer W even, it is possible to suppress a reduction in thickness of the resist film by supplying a dry gas to the surface of the wafer W to reduce fluidity of the wafer W. That is to say, by increasing the rational speed of the wafer W during the spreading and drying, it is possible to shorten the time for the coating process and also to broaden a range of a film thickness of the completed resist film.

Further, a movement range of a supply position of the dry gas is 50 mm to 150 mm from the center of the wafer W having a diameter of 300 mm. If the dry gas is discharged to a position excessively biased to the center of the wafer W, a range in which the dry gas is spread in the surface of the wafer W is narrowed, resulting in a reduction in fluidity locally in a portion of the wafer W. Thus, it is difficult to adjust the film thickness uniformity of the wafer W. By spraying the dry gas to an outer region than 50 mm from the center of the wafer W, the dry gas is sprayed to a broad range of the wafer surface. Thus, this reduces the fluidity of a broad range of the surface of the wafer W, whereby it becomes easy to adjust the film thickness uniformity.

Further, although the gas nozzle 4 repeatedly reciprocates about 50 mm to 150 mm when supplying the dry gas, the dry gas may be supplied without moving the gas nozzle 4. In a case where a supply position of the dry gas is fixed, a position closest to the center of the wafer W within a range in which the dry gas is supplied preferably ranges from 50 mm to 120 mm from the center of the wafer W. If a supply position of the dry gas is fixed to a position excessively biased to the periphery of the wafer W and the dry gas is supplied, a region where the dry gas is sprayed on the surface of the wafer W is confined to a narrow range of the periphery. In addition, by supplying the dry gas while moving the gas nozzle 4, the fluidity of the resist film can be reduced over a broader range of the surface of the wafer W, whereby it becomes further easy to adjust the film thickness uniformity.

Further, if the rotational speed of the wafer W is high, a film thickness may easily become uneven when the dry gas is sprayed. Therefore, a rotational speed during the reflow process preferably ranges from 500 rpm to 1000 rpm in terms of making the resist film even and suppressing unevenness of the film thickness.

Further, the coating film forming apparatus of the present disclosure may have a configuration in which the ring plate 5 is not installed. In addition, a discharge direction adjusting mechanism for making a discharge direction of a gas inclined toward an outer peripheral side of the wafer W may be installed in the gas nozzle 4. For example, it may be configured such that a proximal end of the gas nozzle 4 is pivotably installed in the arm 47 through a horizontally extending shaft portion, and a discharge direction of the gas nozzle 4 may be adjusted between an immediately lower side and an outer peripheral direction of the wafer W through a pivot mechanism in response to a control signal from the control part 6. With this configuration, a discharge angle of the dry gas with respect to the surface of the wafer W may be varied by pivoting the gas nozzle 4. Further, the discharge angle of the dry gas may be varied and, the gas may be initially discharged toward the immediately lower side and gradually inclined toward the outer peripheral side during the process of supplying the dry gas to the wafer W.

Further, during the process of supplying a gas from the gas nozzle 4 toward the wafer W, the ring plate 5 may be moved down to a descending position or a gas may be supplied from the gas nozzle 4 to a gap between the ring plate 5 and the wafer W.

In addition, the dry gas may be supplied after the time t5 at which the rotational speed of the wafer W illustrated in FIG. 4 starts to be increased to the third rotational speed or at the time t6 at which the ring plate 5 starts to be moved down.

Figure 5:
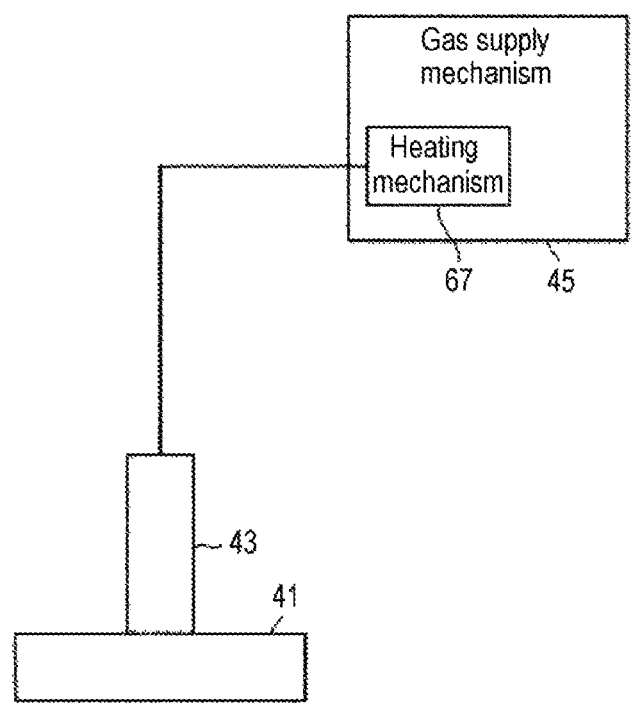
FIG. 5 is a side view illustrating another example of a dry gas supply part.

Further, as illustrated in examples described later, it is possible to adjust a film thickness of a coating film formed on the wafer W by adjusting a supply time of the dry gas. Thus, the supply time of the dry gas may be written in a process recipe (which describes processing conditions or processing procedures) for performing the coating process on the wafer W. In this manner, since the dry gas is supplied for a time duration determined based on a type (lot) of wafer W, a coating film having a film thickness required for the lot is formed on the wafer W. Further, in supplying the dry gas to the wafer W, a heated dry gas may be supplied. For example, as illustrated in FIG. 5, it may be configured such that a dry gas heating mechanism 67 is installed in the gas supply mechanism 45 and a heated dry gas is supplied from the gas nozzle 4. As in the examples described later, by heating the dry gas and then supplying the same to the wafer W, it is possible to increase a film thickness of a film formed on the wafer W. Thus, a film thickness of a coating film may be adjusted based on a heating temperature of the dry gas. By increasing the heating temperature of the dry gas, it may be possible to increase volatility of a solvent within a coating film, but if the heating temperature is too high, there is a possibility of degrading uniformity of a film thickness due to rapid acceleration of drying, and in consideration of acceleration of a chemical reaction in a coating film such as a bridging reaction, the temperature of the dry gas preferably ranges from 25 to 60 degrees C.

Examples

In order to verify the effects of the embodiment of the present disclosure, the following test was performed. First, the processes were performed by rotating a water W based on the time chart illustrated in the embodiment, and supply times of a dry gas supplied from the gas nozzle 4 were set to 3, 5, 7, 9, 11, and 13 in examples 1-1 to 1-6. Also, a temperature of the dry gas was set to a room temperature (25 degrees C.). Further, a comparative example was an example like example 1-1, excluding that the dry gas was not supplied from the gas nozzle 4.

Further, in example 2, a supply time of a dry gas using the dry gas supply part illustrated in FIG. 5 was set to 7 seconds and a dry gas heated to have a temperature of 50 degrees C. was supplied.

Figure 6:
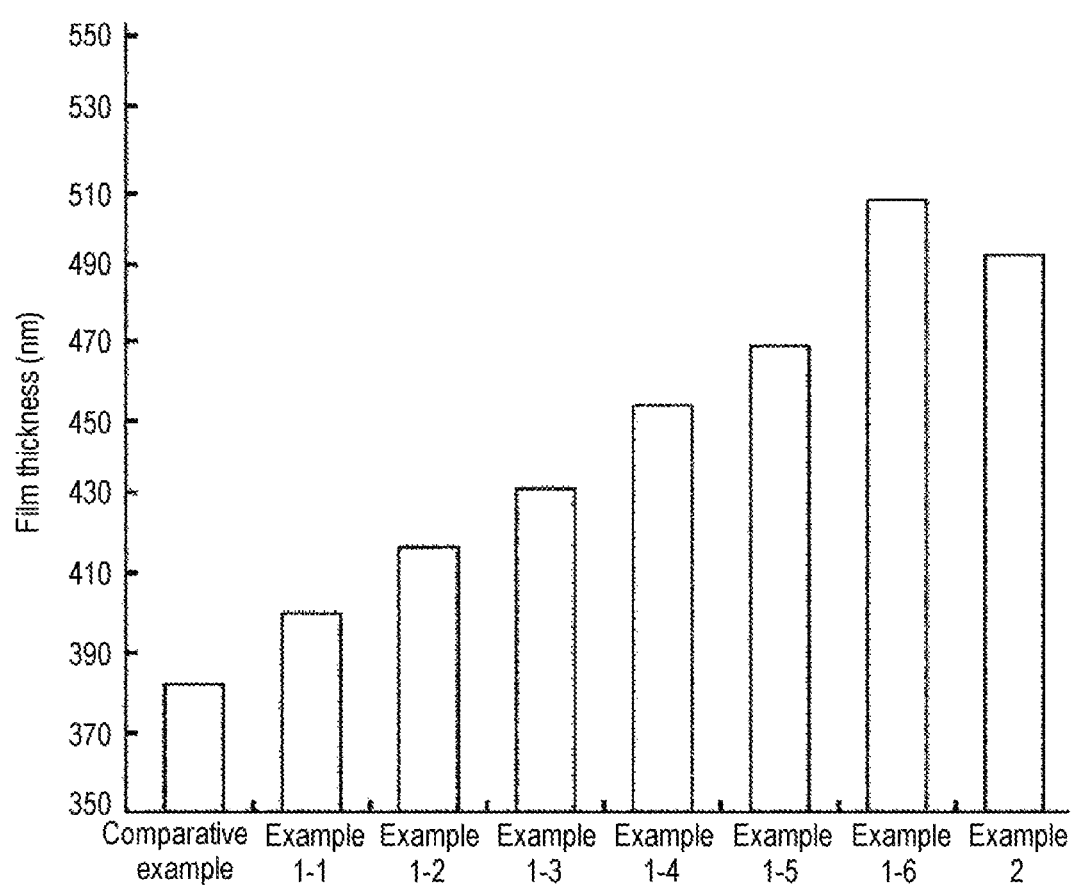
FIG. 6 is a characteristic view illustrating film thicknesses of films formed in examples and a comparative example.

FIG. 6 illustrates an average film thickness of resist films obtained in the comparative example and examples 1-1 to 1-6, and 2. A film thickness in the comparative example was 384 nm, but film thicknesses in the examples 1-1 to 1-6 were 399 nm, 415 nm, 432 nm, 455 nm, 471 nm, 509 nm, respectively. As the supply time of the dry gas is lengthened, a resist film having a larger film thickness may be obtained.

Further, in the example 2, a film thickness was 495 nm. Since a film thickness in example 1-3 in which a dry gas at a room temperature was supplied for 7 seconds was 432 nm, a film thickness of the resist film may be further increased by using the heated dry gas.

Second Embodiment

Subsequently, a process of forming a coating film performed in the coating film forming apparatus 1 will be described with reference to FIGS. 7 and 8. FIG. 7 illustrates a profile regarding a lapse time of an RPM of a wafer W. A value of the vertical axis of the graph represents an RPM (revolution/min.) of the wafer W, and in this graph, a pattern is illustrated to facilitate understanding of the present disclosure, which is not a reproduction of a pattern of an RPM of an actual device. Further, the graphs starting from the second stage are a time chart representing a supply and a stop of a resist solution, and a time chart representing a supply and a stop of a gas, from the upper side.

First, the ring plate 5 is disposed in an ascending position, a wafer W is loaded into the resist coating apparatus 1 by an external transfer mechanism (not shown), and exchanged by the spin chuck 11 through a cooperative operation of the transfer mechanism and the elevation pin 23. An inert gas has been already supplied toward the cup 2 by the FFU 14 within the housing. A series of operations including this operation are executed by the program in the control part 6.

Subsequently, the nozzle unit 3 in the retraction position is moved to an upper side of the central portion of the wafer W, and a pre-wetting solvent is discharged from the solvent nozzle 31 to the central portion of the wafer W rotated by the spin chuck 11. In this manner, the solvent is applied to the entire surface of the wafer W by the centrifugal force, and wettability of the surface of the wafer W with respect to the coating solution is enhanced. Subsequently, the RPM of the spin chuck 11 is reduced to, for example, stop the rotation of the spin chuck 11.

Thereafter, a resist solution as a coating solution is supplied to the wafer W, and a liquid film forming process of forming a liquid film of the resist solution is performed. In this process, as illustrated in FIG. 8A, the ring plate 5 is disposed in an ascending position, and, the resist solution is supplied from the coating solution nozzle 30 to the central portion of the wafer W while rotating the wafer W by the spin chuck 11. As illustrated in FIG. 7, in this process, the resist solution is supplied in a state where the RPM of the spin chuck 11 is gradually continuously accelerated from, for example, 0 rpm to an RPM (first RPM), for example, 500 rpm, when the supply of the resist solution is completed, with an accelerating speed of, for example, 1000 rpm/s. The resist solution supplied to the central portion of the wafer W is spread toward an outer side on the surface of the wafer by a centrifugal force of rotation of the wafer W to form a liquid film on the entire surface of the wafer W. When the supply of the resist solution is completed, the nozzle unit 3 is moved to the retraction position.

A resist solution having a viscosity of 1000 cp or higher has low fluidity, compared with a resist solution having a lower viscosity. Accordingly, when an RPM at a time at which the resist solution starts to be supplied is high, the resist solution is spread in a distorted shape on the surface of the wafer. On the other hand, when the wafer W is rotated at a predetermined low RPM from a time at which the resist solution starts to be supplied to a time at which the supply of the resist solution is completed, the fluidity of the resist solution is reduced as the resist solution moves toward the peripheral portion of the wafer W, making it difficult for the resist solution to be spread. From this, in the liquid film forming process, it is desirable that the resist solution is supplied while the spin chuck 11 is gradually accelerated, for example, from a stop state to the first RPM, whereby the resist solution is uniformly spread in a diameter direction in the surface of the wafer. Further, if the RPM (the first RPM) is too high at a time when the supply of the resist solution is completed, the surface of the film may be easily distorted. Further, this condition is not appropriate for formation of a resist film having a large target film thickness. If the first RPM is too low, the time required for forming a liquid film of a resist solution on the entire surface of the wafer is lengthened. From this, it is preferable that the first RPM is set to fall within a range of, for example, 200 rpm to 700 rpm.

In the resist solution having such a high viscosity, a time is taken for the resist solution to be widely spread on the entire surface of the wafer. Therefore, the resist solution may be continuously supplied from the coating solution nozzle 30 during the liquid film forming process, or the supply of the resist solution may be stopped during the process and the resist solution may be continuously spread by keeping the wafer W rotated. A timing of supplying the resist solution may be appropriately set based on the viscosity or type of the resist solution. Further, during the liquid film forming process, after the wafer W is accelerated to reach the first RPM when the supply of the resist solution is completed, the wafer may be rotated at the first RPM±50 rpm until the resist solution is widely spread to the entire surface of the wafer.

Thereafter, a reflow process of making the liquid film of the coating solution even is performed. In the reflow process, as illustrated in FIG. 8B, in a state where the ring plate 5 is disposed in an ascending position, the wafer W is rotated at the second RPM, the gas nozzle 4 is positioned above the wafer W, and a heated gas is supplied. The gas nozzle 4 may be set to, for example, a height at which a lower surface of the gas nozzle 4 is aligned with a lower surface of the ring plate 5, and a gas is discharged, while the gas nozzle 4 is horizontally moving in a radial direction of the wafer W within the cutout portion 54 formed in the ring plate 5. FIG. 8B illustrates a state where the gas nozzle 4 moves in the cutout portion 54 of the ring plate 5.

A region where a gas is supplied in the wafer W having a size of, e.g., 300 mm is a region between a position, for example, 50 mm spaced apart from the center of the wafer W toward an outer side and an outer edge (position spaced apart from the center of the wafer W by 150 mm) of the wafer W. Further, within the region, a gas is supplied for, for example, 7 seconds, while the gas nozzle 4 repeatedly reciprocates.

In the reflow process, by supplying a gas to the liquid film of the surface of the wafer, volatilization of a solvent contained in the resist solution is accelerated, and thus, viscosity of the resist solution is increased. In this manner, in a state where the fluidity of the resist solution of the surface of the wafer is reduced, the liquid film of the resist solution is made even, whereby an in-plane distribution of the film thickness of the liquid film is adjusted. In this example, when the reflow process is completed, the supply of the gas from the gas nozzle 4 is stopped and the gas nozzle 4 is moved to the retraction position.

When the RPM of the wafer W is too high during the reflow process, the surface of the film is easily distorted when a gas is sprayed. Therefore, the second RPM is within a range of ±50 rpm with respect to the first RPM (RPM when the supply of the resist solution is completed) in terms of making the resist film even and suppressing the distortion of the film thickness, and also, preferably set to, for example, 500 rpm or below. In addition, a supply flow rate of a gas during the reflow process is appropriately set to volatilize the solvent within the resist solution and suppress the distortion of the film thickness of the resist film due to an air current of the gas.

Further, the reason why the supply region of a gas ranges, for example, from 50 mm to 150 mm from on the center of the wafer W having a diameter of 300 mm is because, if a gas is discharged to a position excessively biased to the center of the wafer W, a range of the wafer surface in which the gas is sprayed is too narrowed, locally degrading the fluidity of the wafer W, which leads to a possibility that the film thickness uniformity is difficult to adjust. By spraying a gas to a wide range of an outer region than, for example, 50 mm, from the center of the wafer W, the fluidity of a liquid film of a broad range of the surface of the wafer is reduced, whereby it becomes easy to adjust the film thickness uniformity. In addition, by supplying the gas while moving the gas nozzle 4, the fluidity of the resist film of a broader range of the surface of the wafer can be reduced, whereby it becomes further easy to adjust the film thickness uniformity.

Further, although a gas is supplied during the reflow process in the profile illustrated in FIG. 7, the gas may be continuously supplied during the reflow process or the supply of the gas may be stopped during the process. Since the fluidity of the resist solution is reduced by supplying a gas, it is preferable that the gas is supplied after the resist solution is widely spread on the entire surface of the wafer W. For example, the resist solution may be supplied, for example, immediately before the liquid film forming process is completed.

Further, in the aforementioned example, the gas is supplied while the gas nozzle 4 is moved, but a supply position of the gas may be fixed without moving the gas nozzle 4. In a case where the supply position of the gas is fixed, a position closest to the center of the wafer W within a range in which the gas is supplied is preferably, for example, 50 mm to 130 mm, from the center of the wafer W. If the gas is supplied by fixing the supply position of the gas to a position excessively biased to the periphery of the wafer W, a region in which the gas is sprayed on the surface of the wafer W is limited to a narrow range of the periphery.

Subsequently, a film thickness adjusting process of adjusting a film thickness of a coating film to a target film thickness is performed. As illustrated in FIG. 8C, for example, the film thickness adjusting process is performed by disposing the ring plate 5 in a descending position and rotating the wafer W at a third RPM, for example, 1000 rpm, higher than any one of the first RPM of the liquid film forming process and the second RPM of the reflow process, for a predetermined period of time, for example, 1 to 2 seconds. In this film thickness adjusting process, a film thickness is adjusted based on an RPM by rotating the wafer W at a high RPM momentarily. The third RPM is preferably set to, for example, 500 rpm to 1200 rpm. This is because it does not take much time even if the RPM is not high, since the film thickness has been adjusted to a certain degree in the reflow process. Further, if the RPM is too high, a surface of the film may be distorted. Further, since the film thickness has been adjusted to a certain degree during the reflow process, the time required for performing the film thickness adjusting process is preferably set to, for example, 2 to 10 seconds.

Thereafter, a dry process of drying the coating film is performed. In the dry process, the ring plate 5 is disposed in a descending position, and the resist film is dried by rotating the wafer W at a fourth RPM lower than the third RPM during the film thickness adjusting process. The fourth RPM is preferably set to an RPM, for example, 5 rpm to 200 rpm, which is an RPM having a degree at which the resist film is dried and the resist solution is not centrifugally dried. In this example, the wafer is rotated at an RPM, for example, 10 rpm, lower than the first RPM of the liquid film forming process, thereby drying the resist film while suppressing a liquid flow of the resist solution on the surface of the wafer.

As described above, the ring plate 5 is disposed in an ascending position in the process of supplying a solvent, the liquid film forming process of supplying a resist solution, and the reflow process of making the resist film even. Thus, a solvent or a resist solution scattered from the wafer W is suppressed from being attached to the ring plate 5 when a solvent or a resist solution is supplied or when the resist solution is spread.

Meanwhile, the ring plate 5 is disposed in a descending position during the process of adjusting a film thickness of the resist film and the dry process. Thus, since a height of a flow path of an air current toward the peripheral portion from the central portion of the wafer W is limited by the lower surface of the ring plate 5, an air current toward the peripheral portion from the central portion of the wafer W flows out as a laminar flow without becoming a turbulent flow. As the RPM of the wafer W is higher, the air current on the wafer W is easy to become a turbulent flow. However, since the air current above the peripheral portion of the wafer W is flow-rectified by the ring plate 5, the distortion of the film due to a turbulent flow is suppressed on the surface of the liquid film of the resist solution, thereby enhancing in-plane uniformity of a film thickness. In this manner, the dry process is executed for a predetermined period of time, and, after that, the rotation of the wafer W is stopped and a series of coating processes are completed.

In the aforementioned embodiment, in the spin coating method, the liquid film of the resist is made even by rotating the wafer W at an RPM within a range of ±50 rpm with respect to an RPM of the wafer W when the supply of the resist solution is completed after the resist solution is supplied to the wafer W, while the fluidity of the resist solution is reduced by supplying a gas to the surface of the wafer W. After that, the RPM of the wafer W is increased to adjust a film thickness and then decreased to dry the resist film. By reducing the fluidity of the resist solution by supplying the gas to the surface of the wafer W, it is possible to increase a film thickness of the resist film, compared with a case where the gas is not supplied. Thus, since the film thickness can be adjusted by supplying the gas, in addition to the adjustment of the film thickness by controlling the RPM of the wafer W, it is possible to form a coating film having a film thickness in a broader range using the same resist solution having the same viscosity and type. Further, since a high viscosity resist solution (coating solution) having a viscosity of, for example, 1000 cp or higher is appropriate for forming a coating film, it is possible to form a coating film having a film thickness of, for example, 1 μm or greater by using a coating solution having such a viscosity.

Figure 9:
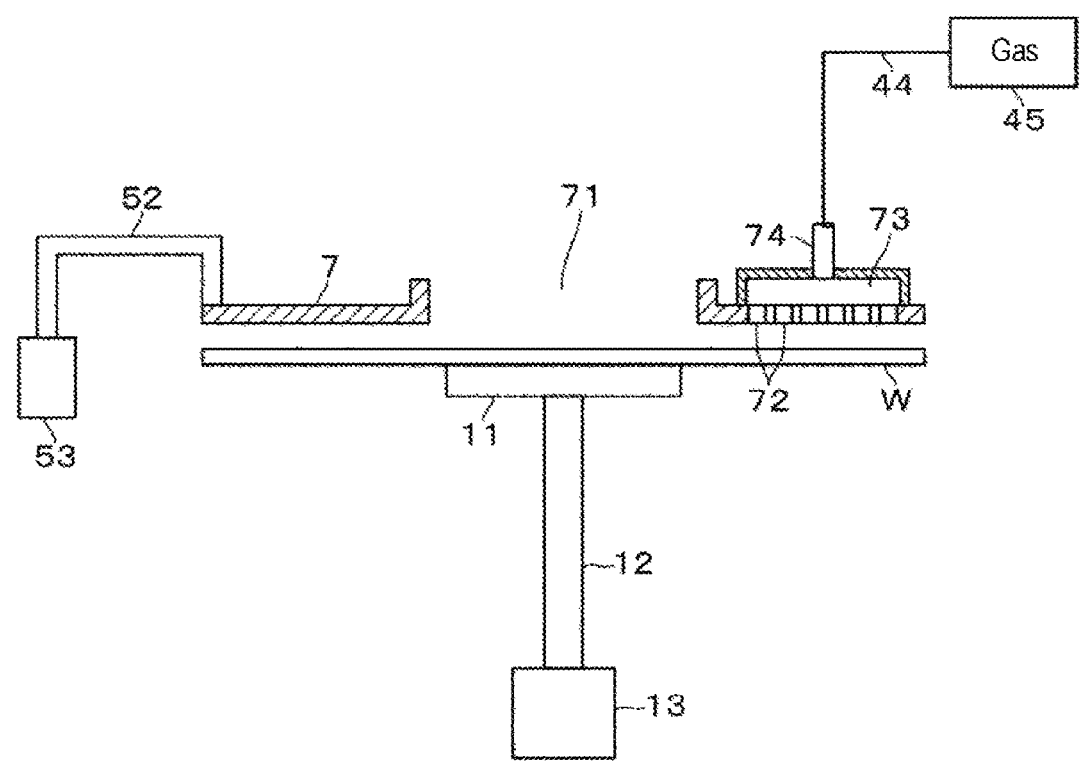
FIG. 9 is a longitudinal cross-sectional side view illustrating another example of a ring plate used in the coating film forming apparatus.
Figure 11A:
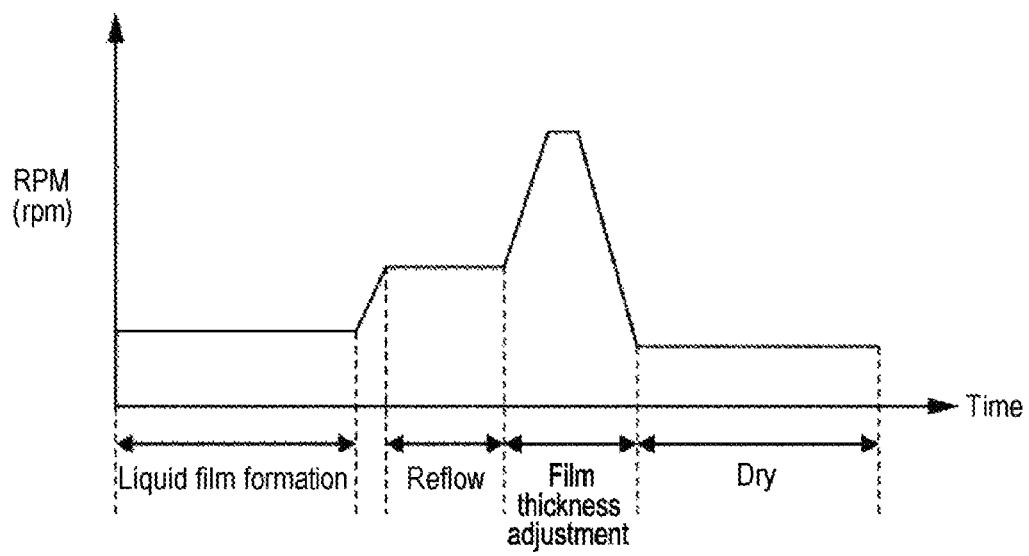
FIGS. 11A and 11B are explanatory views illustrating another example of a time chart of an RPM of a wafer.
Figure 11B:
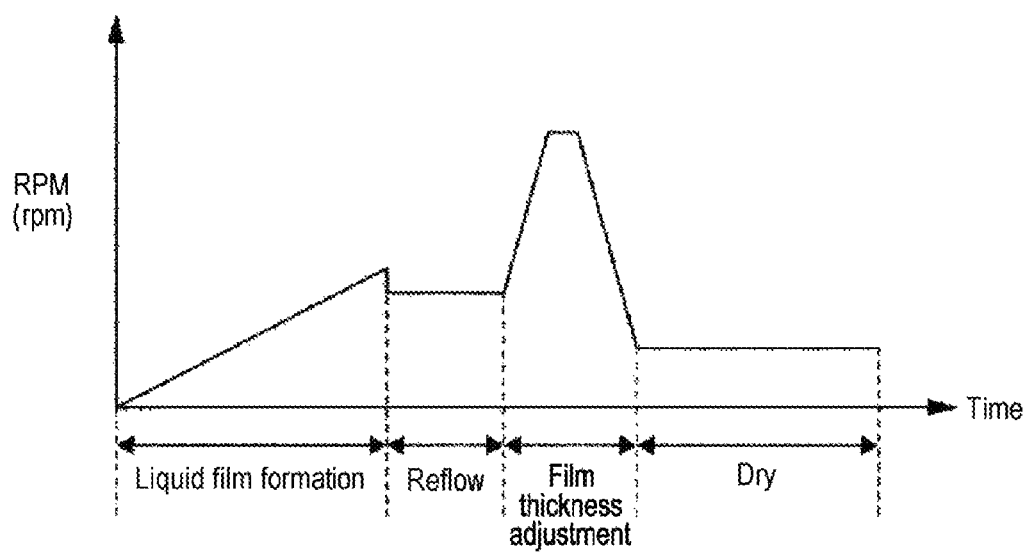

Subsequently, a configuration example in which a gas is supplied through the ring plate 7 will be described as another example of the embodiment of the present disclosure. As illustrated in FIGS. 9 and 10, a plurality of gas discharge holes 72 are formed to extend through the ring plate 7 in a portion of the ring plate 7 forming an annular member having an opening 71 at a central portion thereof. A buffer chamber 73 configured to cover the gas discharge holes 72 is formed on the surface side of the ring plate 7, and a gas introduction part 74 is installed at the center of an upper portion of the buffer chamber 73. The gas introduction part 74 is connected to a gas supply mechanism 45 through the supply path 44. With this configuration, the gas can be diffused in a buffer chamber 73 and is supplied to the wafer W in a shower form through the gas discharge holes 72.

FIG. 10A is a plane view of the buffer chamber 73 when viewed from above, and FIG. 10B is a plane view when the buffer chamber 73 is removed. In this example, a gas supply part is configured by the gas discharge hole 72 and the buffer chamber 73 of the ring plate 7, the gas introduction part 74, the supply path 44, and the gas supply mechanism 45. Also, like the aforementioned embodiment, the ring plate 7 is configured to be supported in a horizontal posture by the support member 52 and moved up and down by the moving mechanism 53 connected to the support member 52.

In the above, in the present disclosure, a coating film may be formed based on a profile regarding a lapse time of the RPM of the wafer W of FIGS. 8A to 8C depending on the viscosity or type of a coating solution. The profile of FIG. 8A is different from the profile of FIG. 4, in that an RPM in the liquid film forming process of supplying a coating solution is set to a predetermined value and the reflow process is performed after the RPM is increased to a second RPM. Even in this case, the second RPM is set to an RPM within a range of +50 rpm with respect to the first RPM when the supply of the coating solution is completed. Even if the RPM of the liquid film forming process is set to a constant value in this way, it is possible to uniformly spread the coating solution on the surface of the wafer W according to the viscosity of the coating film and a processing time of the liquid film forming process. As illustrated in FIG. 8A, when an adjustment time for increasing the first RPM to the second RPM is present between the liquid film forming process and the reflow process, a gas may be supplied toward the wafer W while the RPM is increased, in addition to the reflow process.

Further, the profile of FIG. 8B is different from the profile of FIG. 4, in that the second RPM of the reflow process is lower than the first RPM when the supply of the coating solution in the liquid film forming process is completed. Even in this case, the second RPM is set to an RPM within a range of −50 rpm with respect to the first RPM. Further, when the RPM is accelerated in the liquid film forming process, the RPM of the wafer W may be continuously and gradually accelerated or accelerated in a stepwise manner. Further, in the profiles of FIGS. 4 and 8B, the RPM is gradually increased from a state (0 rpm) where the rotation of the spin chuck 11 is stopped in the liquid film forming process, but the RPM of the spin chuck 11 when the liquid film forming process starts is not necessarily 0 rpm. In addition, the fourth RPM of the dry process of the coating film may be set to be lower than the third RPM of the film thickness adjusting process because a film thickness is determined in the reflow process and the film thickness adjusting process, and may be set to be higher than the first RPM when the supply of the coating solution is completed and the second RPM of the reflow process.

Moreover, the present inventors recognized that a film thickness of an obtained resist film is increased when a supply time of a gas is lengthened in the reflow process and that, although a supply time is the same, a film thickness of the obtained resist film is increased when a temperature of the gas is increased in the reflow process. Thus, a film thickness of the resist film may be adjusted by controlling at least one of, for example, the supply time of the gas and the temperature of the gas.

Specifically, a target film thickness of a resist film (coating film) and a gas supply time for obtaining the target film thickness of each type of a resist solution (coating solution) are obtained in advance through an experiment. Similarly, a target film thickness of a resist film (coating film) and a temperature of a gas for obtaining the target film thickness according to the classified resist solution (coating solution) under an identical gas supply time are obtained in advance through an experiment. The classification of a resist solution refers to a classification of resist solutions which, for example, have the same resist solution and solvent and different viscosities, and which are used in a single coating film forming apparatus.

Further, a target film thickness of a resist film and a supply time of a gas for each type of a resist film are matched and stored in advance in a memory of the control part 6, and a program may be configured such that a supply time of a gas is set by selecting a type of a resist solution and a target film thickness of a resist film by an operator. In addition, a target film thickness of a resist film and a temperature of a gas for each type of a resist film are matched and stored in advance in the memory of the control part 6, and a program may be configured such that a temperature of a gas is set by selecting a type of a resist solution and a target film thickness of a resist film by an operator.

In the above, in the coating film forming apparatus of the present disclosure, the moving mechanism 53 of the ring plates 5 and 7 is configured such that the support member 52 can be moved up and down and moved in a horizontal direction, and the retraction position of the ring plates 5 and 7 may be set to a position where the ring plates 5 and 7 are moved in a horizontal direction from a position above the peripheral portion of the wafer W, for example, an outer position of the cup 2. Further, in the coating film forming apparatus of the present disclosure, the ring plate may not be installed and the heating mechanism may not be installed in the gas supply mechanism to supply an unheated gas. In addition, instead of installing the heating mechanism in the gas supply mechanism, a heating mechanism formed as, for example, a heater may be installed around the gas nozzle 4, the buffer chambers 41 and 73 of the ring plate 7, or the gas introduction parts 43 and 74, and the heating a gas is performed by heating the buffer chambers 41 and 73 or the gas introduction parts 43 and 74. During the film thickness adjusting process and the dry process, a gas may be supplied to the surface of the wafer, but in order to save a gas, preferably, a gas is only supplied during the reflow process.

According to some embodiments of the present disclosure, in the spin coating method, after a coating solution is spread on a substrate through high speed rotation, the substrate is rotated at a low speed to make a surface of the substrate even, during which a gas is supplied to the surface of the substrate, and thereafter, a rotational speed of the substrate is increased to dry a coating film.

In addition, according to some embodiments of the present disclosure, after the coating solution is supplied to the substrate, by rotating the substrate within a range of ±50 rpm with respect to an RPM when the supply of the coating solution is completed, the liquid film of the surface of the substrate is made even, during which a gas is supplied to the surface of the substrate to reduce the fluidity of the coating solution. Thereafter, the RPM is first increased to adjust a film thickness and then decreased to dry the coating film, thereby forming the coating film. Thus, since the film thickness can be adjusted by changing the fluidity of the coating film by supplying the gas to the surface of the substrate, in addition to the adjustment of the film thickness by controlling the RPM of the substrate, it is possible to form a coating film having a film thickness in a broader range with one type of coating solution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating film forming apparatus, comprising:
   a substrate support part configured to horizontally support a substrate;
   a rotation mechanism configured to rotate the substrate support part around a vertical axis;
   a coating solution nozzle configured to supply a coating solution for forming a coating film to the substrate;
   a gas supply part configured to supply a gas for reducing fluidity of the coating solution to a surface of the substrate; and
   a control part configured to execute a process of supplying the coating solution to a central portion of the substrate and spreading the coating solution by a centrifugal force by rotating the substrate at a first rotational speed; subsequently, a process of decreasing a speed of the substrate from the first rotational speed toward a second rotational speed and rotating the substrate at the second rotational speed to make a surface of a liquid film of the coating solution even; a process of supplying the gas to the substrate by the gas supply part while repeatedly reciprocating the gas supply part between a first position and a second position, when the substrate is rotated at the second rotational speed to reduce fluidity of the coating solution; and, after that, a process of drying the substrate by rotating the substrate at a third rotational speed faster than the second rotational speed, wherein the first position is located at an outer edge of the substrate, and the second position is located at a predetermined distance from a center of the substrate and is closer to the center of the substrate than the first position.

2. The apparatus of claim 1, further comprising:

an annular member configured to cover an upper side of a peripheral portion of the substrate and formed annularly along a circumferential direction of the substrate, in order to flow-rectify an air current above the peripheral portion of the substrate when the substrate is rotated at the third rotational speed; and a moving mechanism configured to move the annular member between a position to cover the upper side of the peripheral portion of the substrate and a standby position.

3. The apparatus of claim 2, wherein the gas supply part is installed separately from the annular member and configured to supply the gas to a gap between the substrate and the annular member.

4. The apparatus of claim 2, wherein the gas supply part is installed in the annular member.

5. The apparatus of claim 1, wherein the gas supply part comprises a buffer chamber in which the gas is diffused and a plurality of gas discharge holes through which the gas diffused in the buffer chamber is supplied toward the substrate in a shower form.

6. The apparatus of claim 1, further comprising a moving mechanism configured to move the gas supply part in a diameter direction of the substrate, wherein, in the process of supplying the gas to the substrate to reduce fluidity of the coating solution, the gas is supplied while moving the gas supply part in the diameter direction of the substrate.

7. The apparatus of claim 1, wherein the gas supply part comprises a discharge direction adjusting mechanism configured to adjust a discharge direction of the gas between an immediately lower side and a peripheral direction of the substrate.

8. The apparatus of claim 1, wherein the gas supply part is configured to discharge the gas in an annular shape along a circumferential direction of the substrate.

9. The apparatus of claim 1, wherein the gas supply part comprises a heating mechanism configured to heat the gas and supply a heated gas to the surface of the substrate.

10. A non-transitory computer-readable storage medium storing a computer program for use in a coating film forming apparatus for forming a coating film on a substrate, wherein the program is organized to execute a method of forming a coating film, the method comprising:

horizontally supporting a substrate in a rotatable substrate support part around a vertical axis;

supplying a coating solution to a central portion of the substrate and spreading the coating solution by a centrifugal force by rotating the substrate at a first rotational speed;

subsequently, decreasing a speed of the substrate from the first rotational speed toward a second rotational speed and rotating the substrate at the second rotational speed to make a surface of a liquid film of the coating solution even;

supplying a gas to a surface of the substrate by a gas nozzle while repeatedly reciprocating the gas nozzle between a first position and a second position, when the substrate is rotated at the second rotational speed to reduce fluidity of the coating solution; and after that, drying the surface of the substrate by rotating the substrate at a third rotational speed faster than the second rotational speed, and wherein the first position is located at an outer edge of the substrate, and the second position is located at a predetermined distance from a center of the substrate and is closer to the center of the substrate than the first position.

11. A coating film forming apparatus, comprising:

a substrate support part configured to horizontally support a substrate;

a rotation mechanism configured to rotate the substrate support part around a vertical axis;

a coating solution nozzle configured to supply a coating solution for forming a coating film to the substrate;

a gas supply part configured to supply a gas for reducing fluidity of the coating solution to a surface of the substrate; and a control part configured to execute a process of supplying the coating solution to a central portion of the substrate while rotating the substrate; a process of making a liquid film of the coating solution even by rotating the substrate at a first RPM within a range of ±50 rpm with respect to a second RPM of the substrate when the supply of the coating solution is completed; a process of supplying the gas to the surface of the substrate while the process of making the liquid film of the coating solution even is performed, to reduce fluidity of the coating solution; thereafter, a process of maintaining an RPM of the substrate at a third RPM higher than both of the second RPM when the supply of the coating solution is completed and the first RPM when the process of making the liquid film of the coating solution even is performed, in order for a film thickness of the coating film to reach a target film thickness; and, thereafter, a process of drying the coating film by decreasing the RPM of the substrate at the third RPM.

12. The apparatus of claim 11, further comprising:

an annular member configured to cover an upper side of a peripheral portion of the substrate and installed annularly along a circumferential direction of the substrate, in order to flow-rectify an air current above the peripheral portion of the substrate; and a moving mechanism configured to move the annular member between a position to cover the upper side of the peripheral portion of the substrate and a standby position.

13. A non-transitory computer-readable storage medium storing a computer program for use in a coating film forming apparatus for forming a coating film by supplying a coating solution to a surface of a substrate horizontally supported in a rotational substrate support part around a vertical axis, wherein the program is organized to execute a method of forming a coating film, the method comprising:

horizontally supporting a substrate in a rotatable substrate support part around a vertical axis;

subsequently, supplying a coating solution to a central portion of the substrate while rotating the substrate;

making a liquid film of the coating solution even by rotating the substrate at a first RPM within a range of ±50 rpm with respect to a second RPM of the substrate when the supply of the coating solution is completed;

supplying a gas to a surface of the substrate while the making a liquid film of the coating solution even is performed, to reduce fluidity of the coating solution;

thereafter, maintaining an RPM of the substrate at a third RPM higher than both of the second RPM when the supply of the coating solution is completed and the first RPM when the making a liquid film of the coating solution even is performed, in order for a film thickness of the coating film to reach a target film thickness; and thereafter, drying the coating film by decreasing the RPM of the substrate at the third RPM.

* * * * *